United States Patent [19]

Kodama

[11] Patent Number: 5,255,237
[45] Date of Patent: Oct. 19, 1993

[54] METHOD OF ERASING A NONVOLATILE SEMICONDUCTOR STORAGE

[75] Inventor: Noriaki Kodama, Tokyo, Japan

[73] Assignee: NEC Corporation, Tokyo, Japan

[21] Appl. No.: 866,510

[22] Filed: Apr. 10, 1992

[30] Foreign Application Priority Data

Apr. 10, 1991 [JP] Japan ................... 3-076635

[51] Int. Cl.$^5$ .............................. G11C 11/40
[52] U.S. Cl. .................. 365/218; 365/185
[58] Field of Search ............ 365/218, 182, 185

[56] References Cited

U.S. PATENT DOCUMENTS

| 4,894,802 | 1/1990 | Hsia et al. | 365/182 |
| 5,077,691 | 12/1991 | Haddad et al. | 365/218 |
| 5,132,935 | 7/1992 | Ashmore, Jr. | 365/185 |
| 5,136,541 | 8/1992 | Arauawa | 365/185 |

OTHER PUBLICATIONS

1990 IEEE Symposium on VLSI Technology, R. Kirisawa et al., "A Nand Structured Cell With a New Programming Technology For Highly Reliable 5V Only Flash EEPROM", pp. 129-130, by R. Kirisawa, et al.

Primary Examiner—Eugene R. LaRoche
Assistant Examiner—Tan Nguyen
Attorney, Agent, or Firm—Burns, Doane, Swecker & Mathis

[57] ABSTRACT

There is provided a method of erasing a nonvolatile semiconductor storage having a floating gate electrode with a constant threshold voltage of a memory cell transistor after an erasing operation and further with high security of superior repeat characteristics of a writing and an erasing operation and voltages free of miss-writing. On the erasing operation, a p-type semiconductor substrate is made into an earth ground, a drain is made into a floating potential and continuous pulses of negative high voltage of which parameters of multiplying pulse intervals by applying pulse numbers is 0.1 seconds or more are applied to a control gate electrode to perform intermittently the Fowler-Nordheim tunnelling of electrons from a floating gate electrode to the p-type semiconductor substrate.

3 Claims, 4 Drawing Sheets

METHOD OF ERASING A NONVOLATILE SEMICONDUCTOR STORAGE

BACKGROUND OF THE INVENTION

The present invention relates to a method of erasing a nonvolatile semiconductor storage, and more particular to a method of erasing operation of an electrically erasable and programmable read only memory (EEPROM) with a floating gate electrode.

As EEPROM types, there is a batch erasing type EEPROM (a flash type EEPROM) capable of electrically batch erasing memories of all memory cells of an array arrangement on a chip or all memory cells in a block divided from memory cell arrays on the chip.

The typical example of erasing operation of the flash type EEPROM as shown in FIG. 1 is described hereinafter. In a structure of a memory cell transistor 9, a p-type semiconductor substrate 1 is provided thereon with a composite gate 6 formed by sequentially embedding a first gate insulating film 2 composed of a silicon dioxide film of a thickness of 100 angstroms, a floating gate electrode 3, a second gate insulating film 4 composed of a composite film formed of a silicon dioxide film and a silicon nitride film of a substantial thickness of 200 angstroms and a control gate electrode 5. Further, the p-type semiconductor substrate 1 is provided thereon with a source 7 and a drain 8 respectively composed of n-type diffusion layers and electrically separated with each other with embracing the composite gate 6. As a general erasing operation, electrons are accumulated in the floating gate electrode 3 and when an erasing operation of memories of the memory cell transistor 9 written in a threshold voltage 8 V, the control gate electrode 5 is made into a ground potential, the drain 8 is made into a floating potential and the source 7 is applied with a high positive voltage, for example, 10 V for 10 miliseconds. The Fowler-Nordheim (F-N) tunnelling of electrons is performed from the floating gate electrode 3 to the source 7 through the first gate insulating film 2 so that threshold voltage of the memory cell transistor 9 is made into about 2 V. However, in such a conventional method of an erasing operation, when positive high voltage is applied to the source 7 to cause the F-N tunnelling, a surface of the source 7 under the floating gate electrode 3 is deeply depleted so as to induce the tunnelling between bands and a part of holes generated thereby is emitted into the first gate insulating film 2. Consequently, there are problems of inefficient erasing operation or a degradation of the first gate insulating film.

As an improved method of erasing of the memories to overcome the above problems, the following methods are well known. In FIG. 1, when the threshold voltage of 8 V written in the memory cell transistor 9 is made into the about 2 V in the erasing state, the p-type semiconductor substrate 1 is made into a ground potential, the source 7 and the drain 8 are made into a floating potential, and a negative high voltage $-14.5$ V is applied to the control gate electrode 5 for 10 miliseconds. The F-N tunnelling of electrons accumulated in the floating gate electrode 3 is performed to the p-type semiconductor substrate 1 for an erasing operation.

According to the above method of erasing operation, on an erasing operation, tunnel current between bands is not produced on the p-type semiconductor substrate 1. Then the first gate insulating film 2 is free of deterioration. Superior repeat characteristics of a writing and an erasing operation and a characteristic free of a miss-writing may be obtained.

Notwithstanding, according to the above method of the erasing operation hereinbefore described, on the erasing operation, there is a further problem of a negative variation of the threshold voltage of the memory cell transistor because an entire portion of the first gate insulating film 2 under the floating gate electrode catches a large amount of electrons by the erasing operation and the caught electrons are slowly emitted to the side of the p-type semiconductor substrate side by a self-electric-field of the floating gate electrode. The negative variation of the threshold voltage on an erasing operation of the memory cell transistor causes an over-erasing state in which the memory cell transistor is in the depletion state.

SUMMARY OF THE INVENTION

In a batch erasing EEPRON or a flash type EEPROM with a floating gate electrode according to the invention, a memory cell transistor is provided with a composite gate formed by sequentially embedding on a semiconductor substrate with a first gate insulating film, a floating gate electrode, a second gate insulating film and a control gate electrode and with a source and a drain on the p-type semiconductor substrate which are electrically separated with each other with embracing the composite gate, wherein the drain is made into a floating potential, continuous pulses of a negative high voltage of which a parameter (I × N) of multiplying pulse interval (I) by pulse applying numbers (N) is 0.1 seconds or more are applied to the control gate electrode and the F-N tunnelling of electrons is intermittently performed from the floating gate electrode to the p-type semiconductor substrate through the first insulating film, where the source voltage is either a ground potential or a floating potential.

PREFERRED EMBODIMENTS OF THE INVENTION

Figure 1:
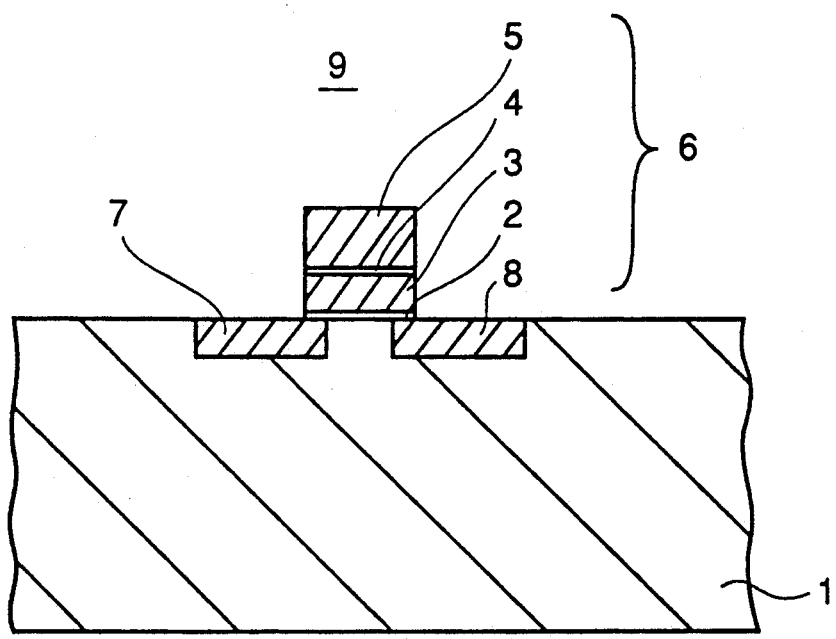
FIG. 1 is a fragmentarily sectioned view of a memory cell transistor of an EEPROM with a floating gate electrode.

A memory cell transistor as shown in FIG. 1 is provided with a composite gate 6 which is formed by sequentially embedding a first gate insulating film 2 composed of a silicon dioxide film of thickness of 100 angstroms, a floating gate electrode 3, a second gate insulating film 4 composed of composite films formed of a silicon dioxide film and a silicon nitride film of substantial thickness of 200 angstroms, and a source 7 and a drain 8 composed of n-type diffusion layers on the substrate, which are electrically separated with each other with embracing the composite gate 6 on the substrate 1. On an erasing operation, a negative voltage is applied to the control gate electrode 5, before the F-N tunnelling of electrons accumulated in the floating gate electrode 3 is performed to the p-type semiconductor substrate 1 through the first gate insulating film 2 at the region under the floating gate electrode 3. While, according to the conventional method of erasing operation, only one pulse of a negative voltage is applied to the control gate electrode 5 for erasing operation so as to cause a variation of the threshold voltage of the memory cell transistor. However, a method of the erasing operation according to the invention is permitted to suppress a variation of the threshold voltage of the memory cell transistor 9 after the erasing operation. For example, in the memory transistor of a threshold voltage the p-type semiconductor substrate 1 is made into a ground potential, the drain 8 and source 7 are made into floating potentials and pulses of $-14.5$ V height and of 10 microseconds width are applied several times to the control gate electrode 5 to make parameter (I × N) of multiplying pulse intervals (I) by pulse applying numbers (N) into 0.1 second or more. For example, pulses of 10 milisecond interval are applied one hundred times and F-N tunnelling of electrons is intermittently performed from the floating gate electrode 3 to the p-type semiconductor substrate 1 through the first gate insulating film 2 to make a threshold voltage of the memory cell transistor 9 into about 2.2 V for an erasing operation.

Figure 2:
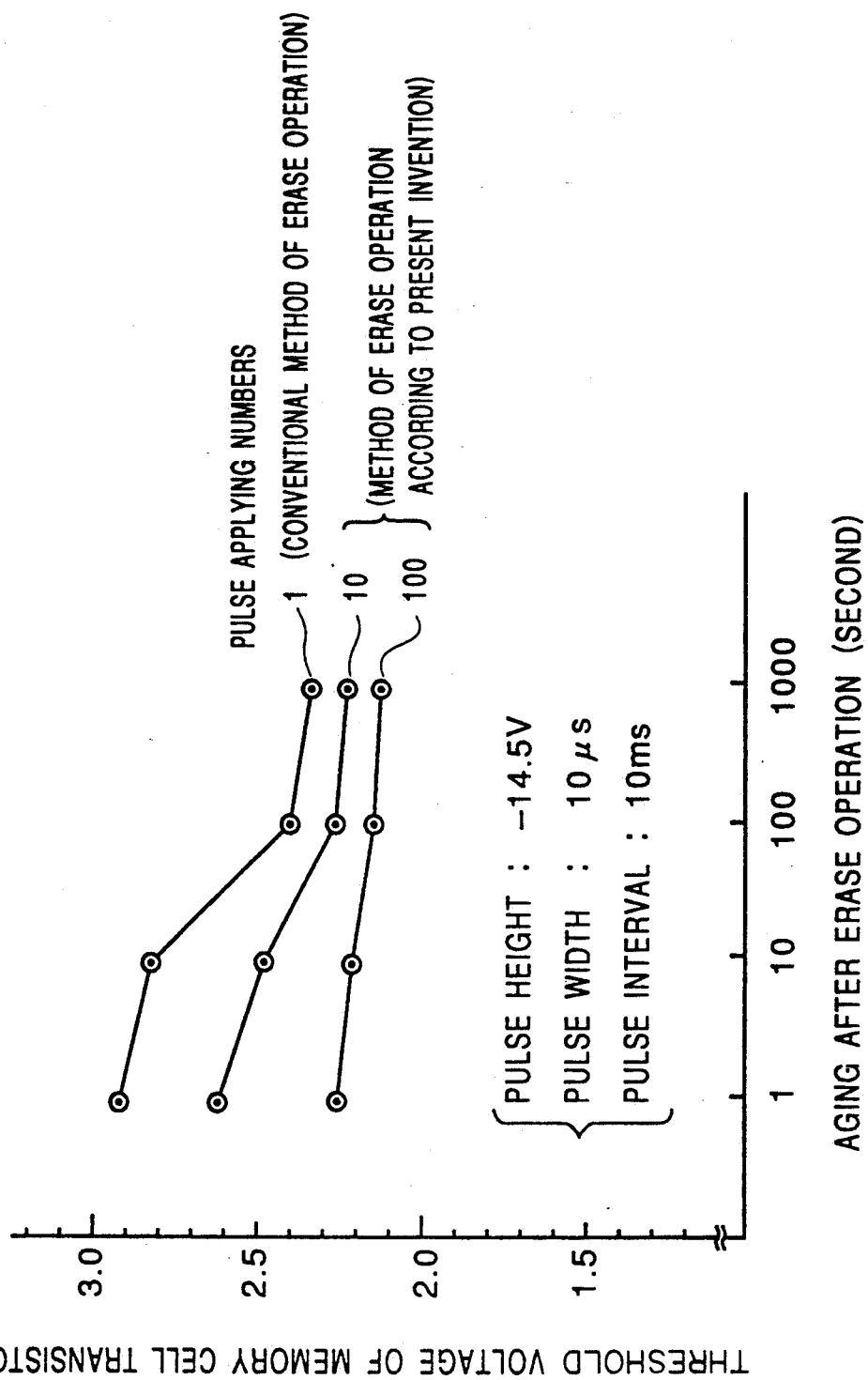
FIG. 2 is a characteristic diagram of a variation of a threshold voltage of a memory cell transistor depending on the numbers of negative voltage pulse applied to a control gate electrode after an erasing operation.

In FIG. 2, pulses of $-14.5$ V height and 10 micro second width are applied to the control gate electrode for an erasing operation and variations of threshold voltages of the memory cell transistor, which depend on pulse applying number after an erasing operation is compared with each other. Where intervals of each pulses is 10 miliseconds. A threshold voltage after an erasing operation slowly decreases and suppression of the variation of decrease is in proportion to pulse applying numbers.

Figure 3:
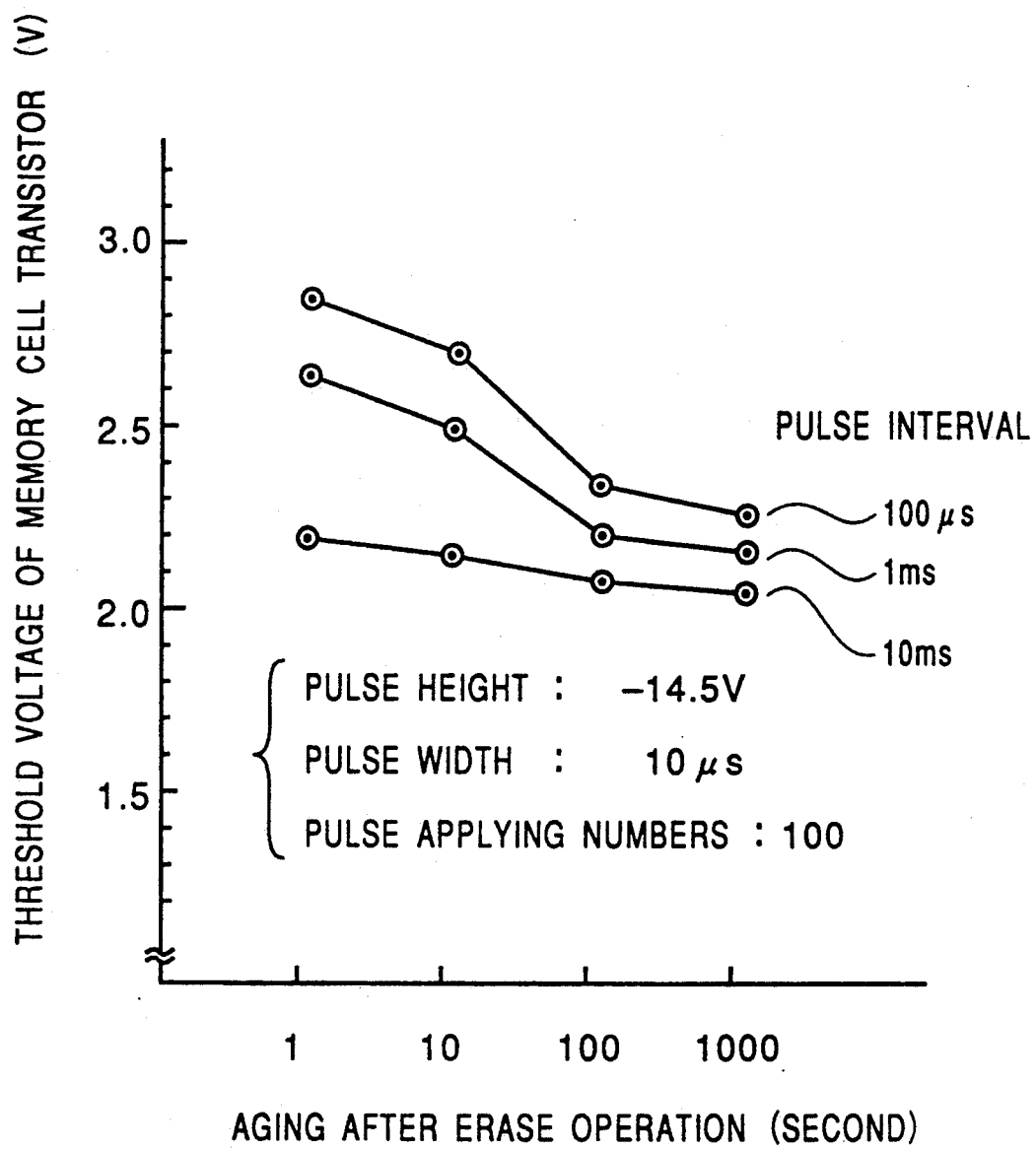
FIG. 3 is a characteristic diagram of a variation of a threshold voltage of a memory cell transistor depending on intervals of negative voltage pulses applied to a control gate electrode after an erasing operation.

In FIG. 3, pulses of $-14.5$ V height and 10 microsecond width are applied one hundred times to the control gate electrode for an erasing operation and variations of a threshold voltage of the memory cell transistor which depend on time intervals of the pulses after an erasing operation are compared with each other. Suppression of the variation of the threshold voltage after an erasing operation is in proportion to time intervals of the pulses. After an erasing operation, a threshold voltage of the memory cell transistor decreases because on an erasing operation electrons are caught to the first gate insulating film 2 under the floating gate electrode 3 of the memory cell transistor 9 and the caught electrons are slowly emitted to the p-type semiconductor substrate 1 by a self electric-field of the floating gate electrode 3. A variation of the threshold voltage is in inverse proportion to pulse numbers applied to the control electrode 5 and time intervals of the pulses.

Figure 4:
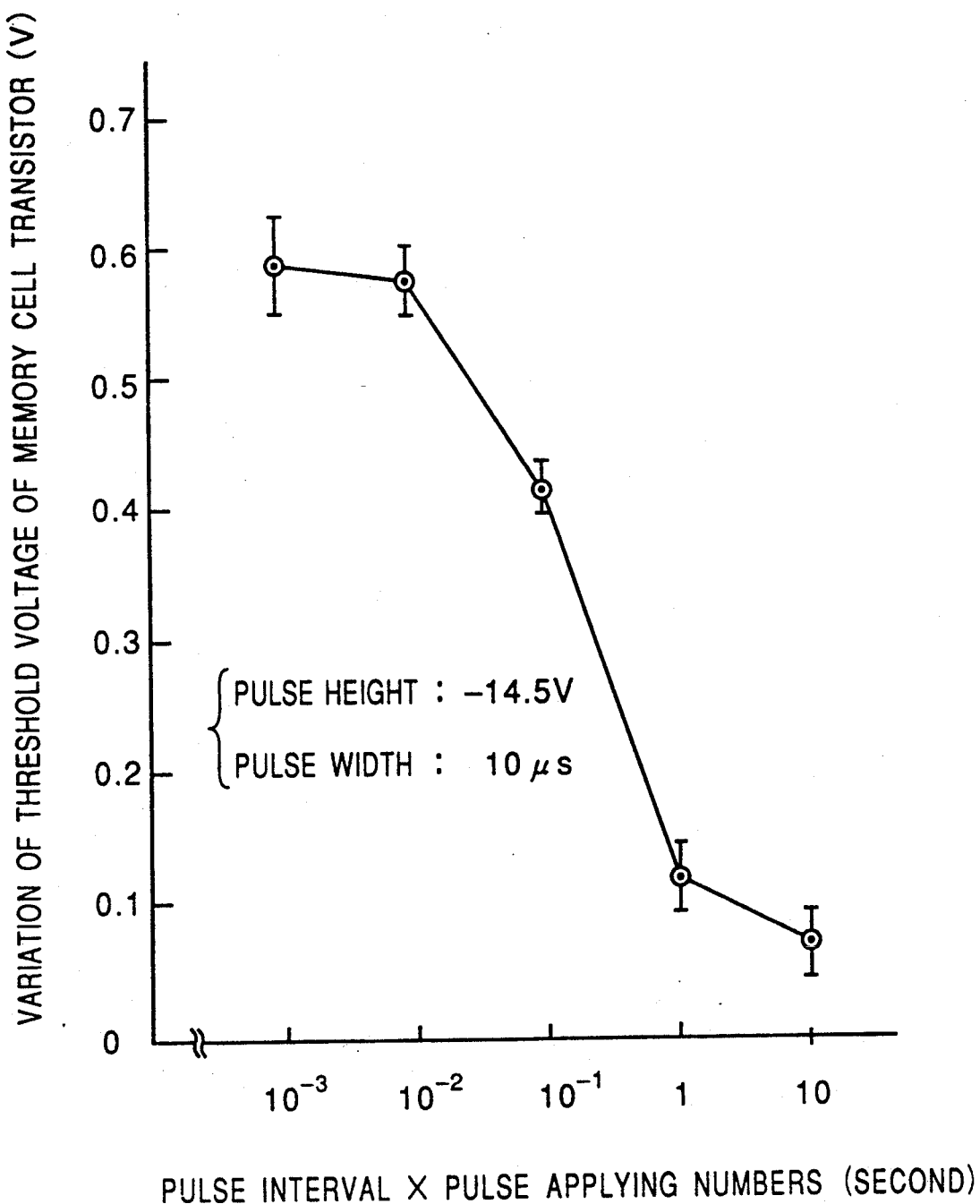
FIG. 4 is a characteristic diagram of a threshold voltage of a memory cell transistor depending on the product of multiplying an interval of negative voltage pulse by pulse numbers thereof applied to a control gate electrode after an erasing operation.

In FIG. 4, on an erasing operation, a variation of a threshold voltage of the memory cell transistor at the time from one second to one thousand seconds depends on a parameter (I × N) of multiplying pulse intervals (I) by pulse numbers (N) of continuous pulses of negative high voltage applied to the control gate electrode 5, where height of each pulses applied to the control gate electrode is $-14.5$ V and width thereof is 10 miroseconcds. When a parameter of multiplying pulse intervals (I) by pulse numbers (N) is about 0.1 seconds or more, a threshold voltage of the memory cell transistor 9 decreases. To obtain constant threshold voltages of the memory cell transistor 9, on an erasing operation continuous pulses of the negative high voltage are applied to the control gate electrode 5 on condition that a parameter (I × N) of multiplying pulse interval (I) by pulse numbers (N) is 0.1 seconds or more. In the first embodiment according to the invention, on an erasing operation the p-type semiconductor substrate 1 is made into a ground potential, the source 7 and the drain 8 are made into floating potentials and negative voltage pulses are applied to the control gate electrode 5 for an erasing operation. A method of a second embodiment according to the invention is hereinafter described.

In the second embodiment, the p-type semiconductor substrate 1 and the source 7 are made into ground potentials, the drain 8 is made into a floating potential and negative pulses are applied to the control gate electrode 5 so that the F-N tunnelling of electrons may be performed from the floating gate electrode 3 to the p-type semiconductor substrate 1 through the first gate insulation film 2 and negative voltage pulses applied to the control gate electrode 5 are made into a parameter 0.1 seconds or more of multiplying pulse intervals (I) by pulse numbers (N). In the first embodiment according to the invention, an electrical current for an erasing operation is applied to the p-type semiconductor substrate 1 to increase a voltage thereof. Then, on an erasing operation, a variation of a threshold voltage of the transistor to be used for control circuits occurrs for starting the memory cell transistor. Notwithstanding, in the second embodiment according to the invention the source 7 has a ground potential and an electrical current for an erasing operation flows to the source 7 without increasing a voltage of the p-type substrate 1.

As hereinbefore described, the memory cell transistor of the flash type EEPROM according to the invention is provided with the composite gate formed on the semiconductor substrate by sequentially embedding the first gate insulating film, the floating gate electrode, the second gate insulating film and the control gate electrode, and with the source and the drain in a surface of the p-type semiconductor substrate, which are composed of n-type diffusion layers electrically separated with each other with embracing the composite gate. In an erasing operation of the memory cell transistor, the p-type semiconductor substrate is made into a ground potential, the drain is made into a floating potential and negative voltage pulses are applied several times to the control gate electrode so as to make a parameter (I × N) of multiplying pulse intervals (I) by applying pulse numbers (N) into 0.1 seconds or more. Then, the F-N tunnelling of electrons accumulated to the floating gate electrode is intermittently performed to the p-type semiconductor substrate through the first gate insulating film for an erasing operation with constant threshold voltages of the memory cell transistor or without a variation thereof and further with high security of superior repeat characteristics of a writing and an erasing operation and voltages free of miss-writing.

What is claimed is :

1. A method of erasing a nonvolatile semiconductor storage provided with a composite gate formed on a surface of a semiconductor substrate by sequentially embedding a first gate insulating film, a floating gate electrode, a second gate insulating film and a control gate electrode and with a source and a drain in the surface of the semiconductor substrate, which are electrically separated with each other with embracing the composite gate, wherein when electrons accumulated to the floating gate electrode are emitted for an erasing operation, a drain potential is made into a floating potential and a plurality of continuous pulses of the negative high voltage of which parameter of multiplying pulse intervals by applying pulse numbers is 0.1 seconds or more are applied to the control gate electrode and Fowler-Nordheim tunnelling of electrons accumulated to the floating gate electrode is intermittently performed to the semiconductor substrate through the first gate insulating film for an erasing operation.

2. A method of erasing a nonvolatile semiconductor storage as claimed in claim 1, wherein a source potential is made into a floating potential on the erasing operation.

3. A method of erasing a nonvolatile semiconductor storage as claimed in claim 1, wherein a source potential is made into a ground potential on the erasing operation.

* * * * *